United States Patent [19]
Sher et al.

[11] Patent Number: 6,154,851
[45] Date of Patent: Nov. 28, 2000

[54] MEMORY REPAIR

[75] Inventors: Joseph C. Sher, Meridian; Gerg A. Blodgett, Nampa, both of Id.

[73] Assignee: Micron Technology, Inc., Boise, Id.

[21] Appl. No.: 08/906,754

[22] Filed: Aug. 5, 1997

[51] Int. Cl.[7] .................................................. G06F 13/00
[52] U.S. Cl. ................................................ 714/5; 714/718
[58] Field of Search ................................... 714/5, 6, 7, 8, 714/10, 25, 30, 31, 39, 42, 46, 48, 718, 723, 733, 763, 799; 365/201, 230.03, 230.06, 230.08; 395/500.02, 500.05; 257/209; 324/765

[56] References Cited

U.S. PATENT DOCUMENTS

| | | | |
|---|---|---|---|
| 5,337,318 | 8/1994 | Tsukakoshi et al. | 371/5.5 |
| 5,359,560 | 10/1994 | Suh et al. | 365/200 |
| 5,473,573 | 12/1995 | Rao | 365/230.01 |
| 5,502,814 | 3/1996 | Yuuki et al. | 395/183.08 |
| 5,519,657 | 5/1996 | Arimoto | 365/200 |
| 5,548,555 | 8/1996 | Lee et al. | 365/200 |
| 5,550,394 | 8/1996 | Sukegawa et al. | 257/209 |
| 5,583,822 | 12/1996 | Rao | 365/230.03 |
| 5,617,366 | 4/1997 | Yoo | 365/201 |
| 5,657,280 | 8/1997 | Shin et al. | 365/200 |
| 5,701,270 | 12/1997 | Rao | 365/230.03 |
| 5,761,145 | 6/1998 | Zagar et al. | 365/226 |
| 5,795,797 | 8/1998 | Chester et al. | 438/4 |

OTHER PUBLICATIONS

Kirihata et al., Flexible test mode approach for 256–Mb Dram, IEEE Journal of solid state circuits, vol. 32, No. 10, pp. 1525–1534, Oct. 1997.

Fackenthal et al., A 3.3V 16 Mbit DRAM–Compatible flash Memory, 1995 Symposium on VLSI circuits digest of technical papers, pp. 67–68, May 1995.

"Pentium/P54C PCI/ISA Chipset", Rev. 2.0, published by Silicon Integrated Systems Corporation, dated Apr. 2, 1995, pp. 2–3, 6–7 and 9.

*Primary Examiner*—Nadeem Iqbal
*Attorney, Agent, or Firm*—Schwegman, Lundberg, Woessner & Kluth, P.A.

[57] ABSTRACT

Method for repair of a memory array. In particular, a key is provided to inquire a memory array for ascertaining availability of redundant elements and programming a memory for access to such redundant elements. Alternatively, a second test key may be supplied to the memory for programming. In this manner, repair of the memory is effected. The memory may be a single memory integrated circuit (chip) or a memory module located in a system, such as a computer. Such repair may be done locally or remotely without uninstalling the defective memory.

40 Claims, 13 Drawing Sheets

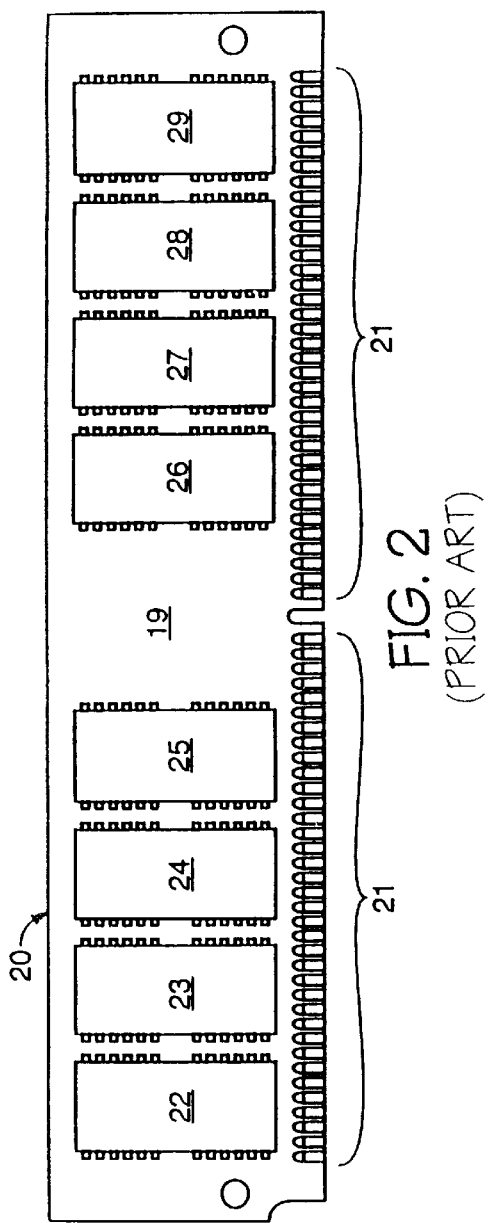
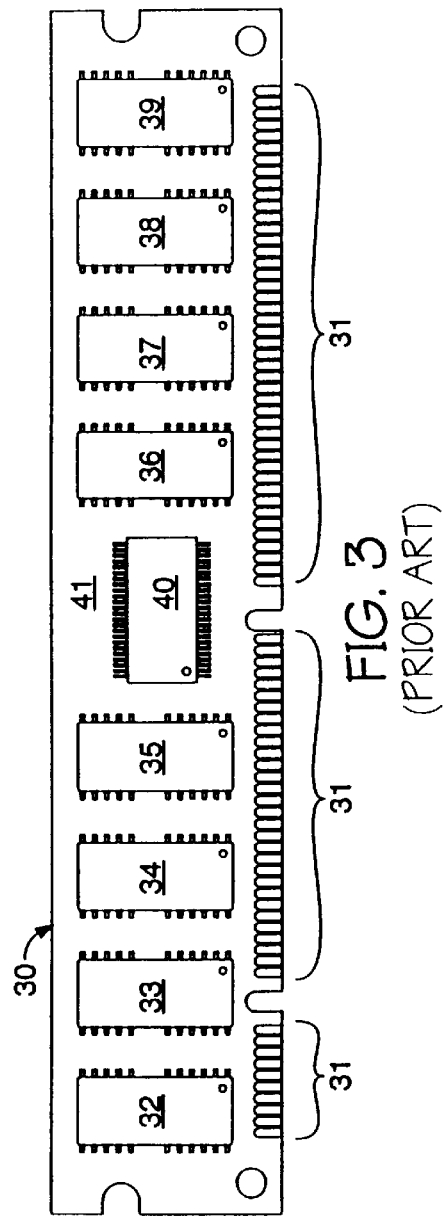

MEMORY REPAIR

FIELD OF THE INVENTION

The present invention generally relates to repair of integrated circuits, and particularly relates to repair of bit errors in an array of memory cells.

BACKGROUND OF THE INVENTION

Semiconductor memory devices, including Dynamic Random Access Memories (DRAMs), Static Random Access Memories (SRAMs), Electrically Erasable Programmable Read Only Memories (EEPROMs), and the like typically include an array of memory cells. The array of memory cells may be arranged in rows and columns. Such cells store information in one of two states, namely a logic high state (a logic "1" state) or a logic low state (a logic "0" state). To access this binary form of information, a unique address is employed. The address is based on column and row locations. The address is decoded by address decode circuitry for identifying the particular row and column of the memory array. In manufacturing such memories, it is sometimes found that a memory cell does not function properly. Accordingly, an address to such a defective cell is identified and rerouted to a redundant memory cell. For this rerouting, the defective memory array address is programmed in a fuse or antifuse bank. The latter being especially applicable to repair a defective die after encapsulation. In this manner, if an address is received to a memory, and it matches a programmed defective address stored in a bank, the bank associated with a redundant location in the array reroutes the access to the redundant location. The redundant location is usually a redundant row or column.

Antifuses for redundant memory applications are generally constructed in the same manner as memory cell capacitors. The antifuse acts as a relative open circuit until programmed. Once programmed, the antifuse acts as a relative short circuit. By relative open circuit and relative short circuit, it should be understood that measurable resistance values exist in both states. In order to program an antifuse, a voltage, often referred to as a programming or super voltage, is applied to the antifuse to cause breakdown of the dielectric material interposed between two capacitive plates. The applied voltage will depend on the voltage required to break down the dielectric for purposes of making it sufficiently conductive; in other words, lowering the dielectrics' resistance to an acceptable limit. Programmed antifuses and unprogrammed antifuses in a bank therefore may be used to represent a binary address.

Conventional memory modules typically have one or more memories attached to a circuit board. Examples of such modules include: Single In-Line Memory Modules (SIMM), Dual In-Line Memory Modules (DIMM), and Multi-Chip Modules (MCM), the latter of which is typically assembled with multiple dies prior to packaging.

In the past, after a die was packaged, it was mounted to a circuit board to form a module, and installed in a computer, to effect any rerouting of defective cells to redundant cells necessitated removal of the defective memory module. Memory is typically installed in a personal computer or work station. Consequently, if a single bit in a memory fails (single bit errors are a typical type of latent defect or field failure), the defective memory or memory module in a computer heretofore was removed from the computer and either disposed of or returned to the manufacturer. Therefore, it would be desirable to selectively repair bit errors in a memory array, and particularly a memory array of a memory module, located in a personal computer without having to uninstall memory.

SUMMARY OF THE INVENTION

The present invention provides method for repair of a memory array having one or more defective cells. The method includes receiving a key to a memory device. A key is conventionally a normally unused combination or sequence of control signals which may be used to specify or initiate an operation to be employed. A memory device may be a memory integrated circuit (chip) or a memory module. The memory device may be put into a mode with a key. It may be first necessary to unlock the memory device prior to putting it into the mode. By unlock, it is meant that the memory device is taken out of its normal mode of operation. A key may be used to unlock the memory device. Normal memory modes are those used for reading or writing data to a memory array. Such normal memory modes are well-known with respect to computer operation. Special modes may be a test mode to test the memory device, or a programmed mode programmed into the memory device which is activated for a preprogrammed operation of the memory device. During the preprogrammed or preconfigured mode, the memory device is read for availability of one or more redundant elements. It is known in the industry to replace a defective memory cell with a redundant element. The programmed mode or test mode may also be employed for putting the memory device into a mode for programming, in which an address information may be received and written to the memory device. Address information may relate to an element to be repaired (e.g., the address of a defective cell) and/or one or more programmable elements used to enable repair and store a repaired address. Typically, the memory is programmed with the defective address for accessing the redundant element. If a first key is employed only for testing for availability of redundant elements, a second test key may be used for initiating a programming mode, when an available redundant element exists.

The present invention provides programming a memory device for repair. After inquiring the memory device to determine if an available redundant elements exist, an address may be received to the memory device. This address may be the same address as that of a defect to be repaired. This address may be a single address or a range of addresses. The address is programmed into a bank of the memory device. The bank may be an antifuse bank, fuse bank, flash memory, and the like. In particular, the address may be programmed with a voltage supply internal to the memory device. In this manner, no external programming voltage supply needs be employed.

In order to prevent unintentional access or programming of a memory device, the present invention provides unlocking the memory device prior to being able to access it. The memory device may be unlocked by providing one or more cycles of information. A cycle of information may include address and/or data cycles in combination with control signal inputs.

It should be understood that a spare or redundant element may be a spare block of cells, a spare row of cells, a spare column of cells, a spare sequence of cells, or a spare cell in accordance with the present invention. Thus, the present invention provides for repair of a portion of a memory array while installed in an information handling system such as a personal computer (PC). Such repair may be done locally or remotely.

Other features and embodiments of the present invention are described or are apparent from reading the detailed description or by practicing the present invention.

BRIEF DESCRIPTION OF THE DRAWINGS

The features of the present invention, as well as objects and advantages, will best be understood by reference to the appended claims, detailed description of particular embodiments and accompanying drawings where:

FIG. 2 is a top elevation view of an exemplary single in-line memory module (SIMM) of the prior art;

FIG. 3 is a top elevation view of an exemplary dual-in-line memory module (DIMM) of the prior art;

Figure 1:
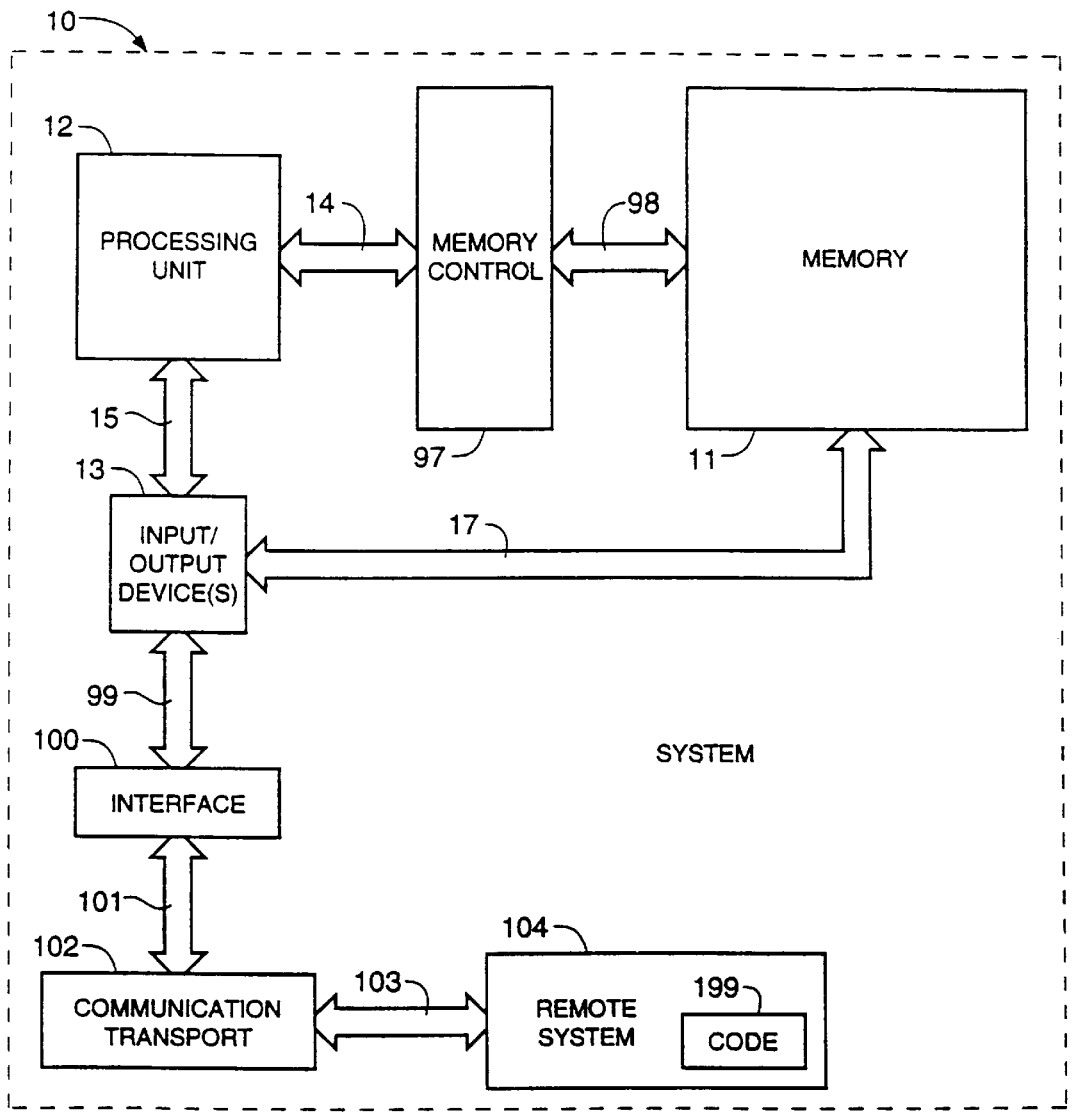
FIG. 1 is a block diagram of a computer system having memory in accordance with the present invention.

Reference numbers refer to the same or equivalent parts of the present invention throughout the several figures of the drawing.

DETAILED DESCRIPTION OF THE PREFERRED EMBODIMENT

Referring to FIG. 1, there is shown a block diagram of computer system 10 having memory 11 in accordance with the present invention. Computer system 10 includes processing unit 12, memory controller 97, input/output device(s) 13, and memory 11. Input/output device(s) 13 are coupled to processing unit through bus 15. Input/output devices include but are not limited to disk drives, tape drives, memory cards, keyboards, voice recognition systems, pointing devices (e.g., mouse, trackball, joy stick and the like), graphics pads, modems, network interfaces, touch screen displays, and the like. Processing unit 12 is coupled to memory controller 97 through bus 14. Memory controller 97 is coupled to memory 11 through bus 98 for providing address, data, and control signals to and from memory 11. Optionally, an alternate memory addressing pathway 17 may couple memory 11 to input/output device 13. Such pathway 17 may be for Direct Memory Addressing ("DMA"). Memory 11 may include any of a variety of well-known memories having cells for storing information. Such memory devices may include DRAMs, SRAMs, EEPROMs, and like memory devices having programmable cells. Moreover, such memory devices may be included in modules, including SIMMs, DIMMs, MCMs, and the like. Therefore, while the present invention is described herein with respect to DRAMs, particularly SIMM and DIMM DRAM modules, it should be understood that the present invention may be employed in a variety of memory devices having cells needing repair.

Interface 100 may be internal to or external from system 10. If internal, interface 100 is included in I/O devices 13. Interface 100 may be a modem, network interface, broadcast receiver/transmitter, or like device coupled to system 10 through pathway 99. Interface 100 is coupled to communication transport 102 through pathway 101. Transport 102 may be any of a variety of well-known means of reception/transmission communication equipment, including but not limited to telephonic equipment, cellular equipment, satellite equipment, network cable equipment, radio equipment, and the like. Remote system 104 is coupled to communication transport 102 through pathways 103. In this manner, repair of memory 11 may be handled remotely from system 10 by providing access to such system via system 104. System 104 may be a computer like that of system 10. Either of such systems 10, 104 may be programmed with code 199 in accordance with the present invention, as explained elsewhere herein.

Referring to FIGS. 2 and 3, there are shown SIMM and DIMM modules 20, 30, respectively, having DRAMs which may be repaired in accordance with the present invention. SIMM module 20 includes DRAMs 22 through 29, inclusive (22–29). These eight DRAMs are mounted to a printed circuit board 19 for connection to a bus interface through pins 21. DIMM 30 includes DRAMs 32 through 39, inclusive (32–39), attached to printer circuit board 41. DRAMs 32–39 may be coupled to a bus interface through pins 31. Additionally, DIMM module 30 includes presence-detect generator 40. In order to provide a full, clear and concise description of the present invention, this specification omits known details with respect to SIMM 20 and DIMM 30.

Figure 4:
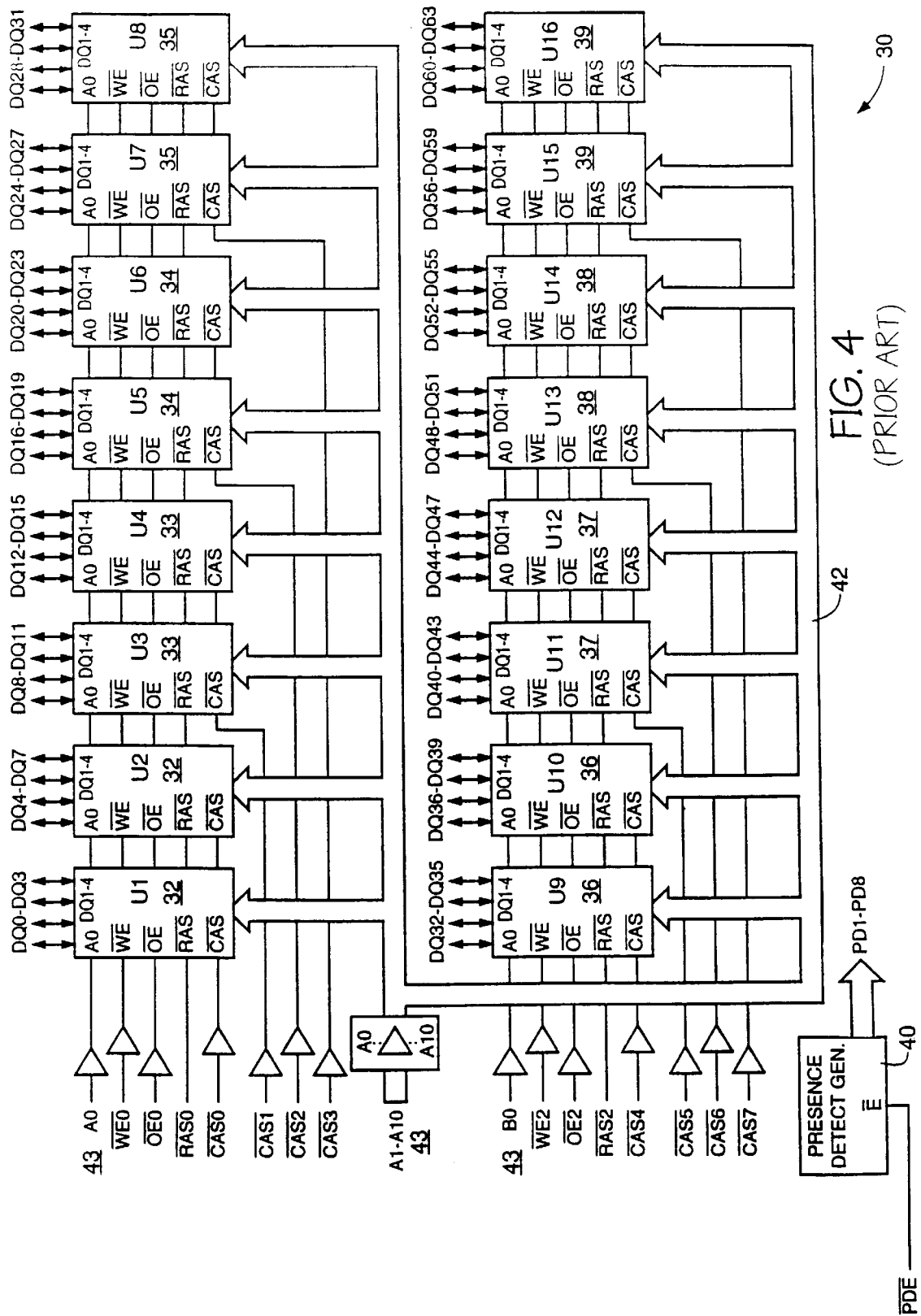
FIG. 4 is a functional block diagram of the DIMM of FIG. 3.

Referring to FIG. 4, there is shown a functional block diagram of DIMM 30 which may be repaired in accordance with the present invention. As indicated, address information 43 is supplied to bus 42 for receipt by DRAMs 32–39. During read or write cycles, each bit is uniquely addressed through 22 address bits, which are entered 11 bits at a time, namely A0 and A1–A10, or B0 and A1–A10. Two copies of address 0 (A0 and B0) are defined to allow maximum performance for 4 byte applications which interleave between two 4-byte banks. A0 is common to DRAMs 32–35, namely DQ0–DQ31, while B0 is common to DRAMs 36–39 for DQ32–DQ63. /RAS0 (/-active low; RAS—row-address-strobe) is used to latch bits A0–A10 for DRAMs 32–35, and /RAS2 is used to latch bits B0 and A1–A10 for DRAMs 36–39. /WE0 (write enable signal 0) is used for enabling DRAMs 32–35, /OE0 45 (output enable signal 0) is for enabling output of DRAMs 32–35, and /CAS0–/CAS3 (CAS—column-address-strobe) and /CAS4–/CAS7 are applied to DRAMs 36–39 and 32–35, respectively. In this manner, control, address, and data information may be supplied to a memory device of the present invention. The term "memory device" as used herein shall be construed to include a memory chip (for example, a DRAM, an SRAM, an EPROM, a Flash Memory, and the like), as well as a memory module having one or more memory chips.

Figure 5:
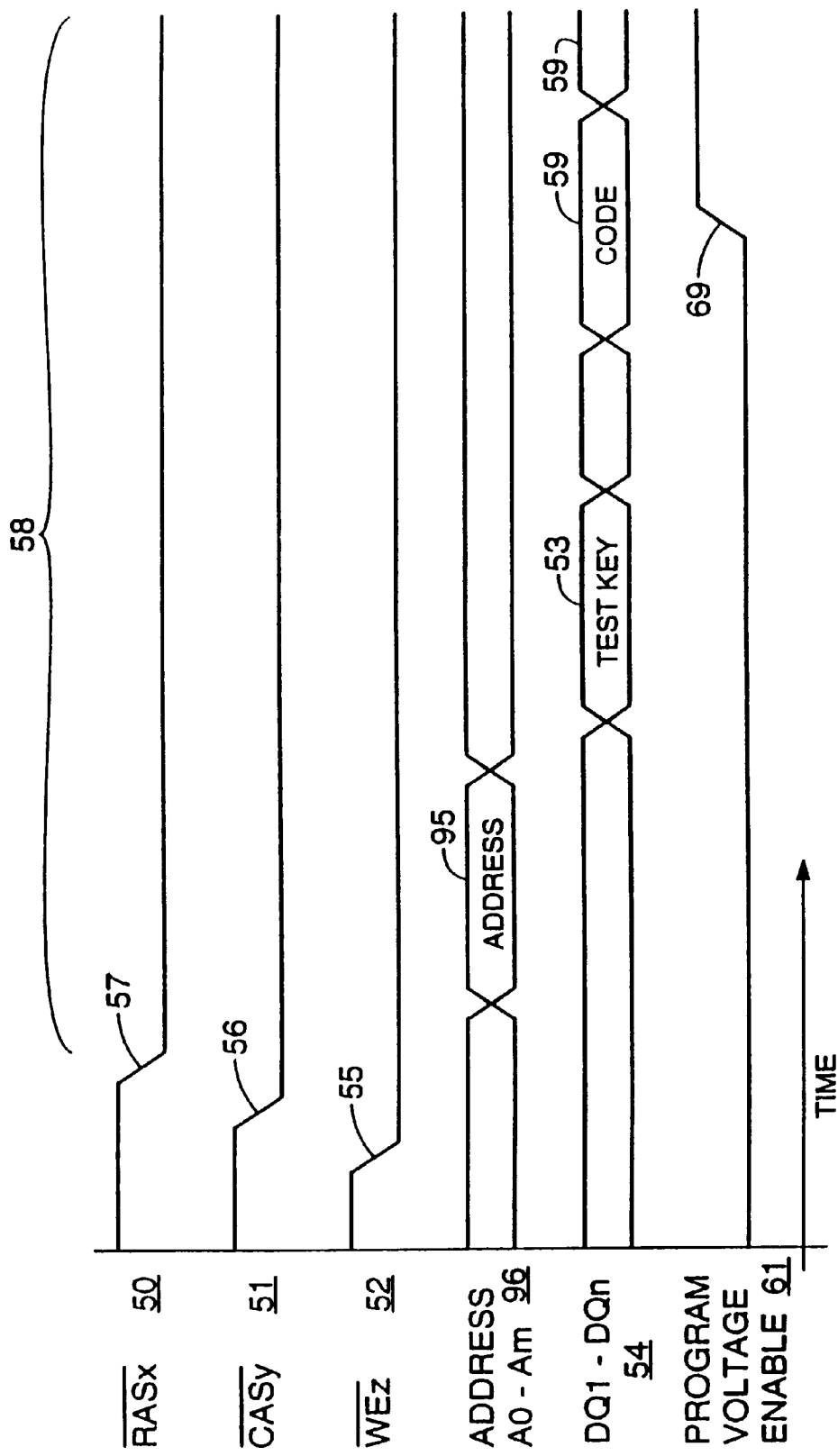
FIG. 5 is a timing diagram for inquiring and programming a memory device for repair of a defective element therein in accordance with the present invention.

Referring to FIG. 5, there is shown a timing diagram for inquiring and programming a memory device in accordance with the present invention. /RASx signal 50, for x an integer, is active low; /CASy signal 51, for y an integer, is active low; and /WEz signal 52, for z an integer, is active low. At time 55, /WEz signal 52 transitions from inactive high to active low. Later at time 56, /CASy signal 51 transitions from inactive high to active low. Still later at time 57, /RASx signal 50 transitions from inactive high to active low. This sequence of transitions at times 55 through 57 causes WCBR (write-CAS-before-RAS) cycle 58 to be invoked. During WCBR cycle 58, test key 53 is provided to a portion of memory 11 (shown in FIG. 1) via input/output pins (DQ pins) such as DQ1–DQn pins 54, for n an integer. Integer, n, may be latched by /$CAS_y$ signal 51 or another control signal. Memory 11 (shown in FIG. 1) includes at least one memory device in accordance with the present invention. Notably, values for integers x, y, z, and n will depend on memory device configuration.

Figures 9, 10:
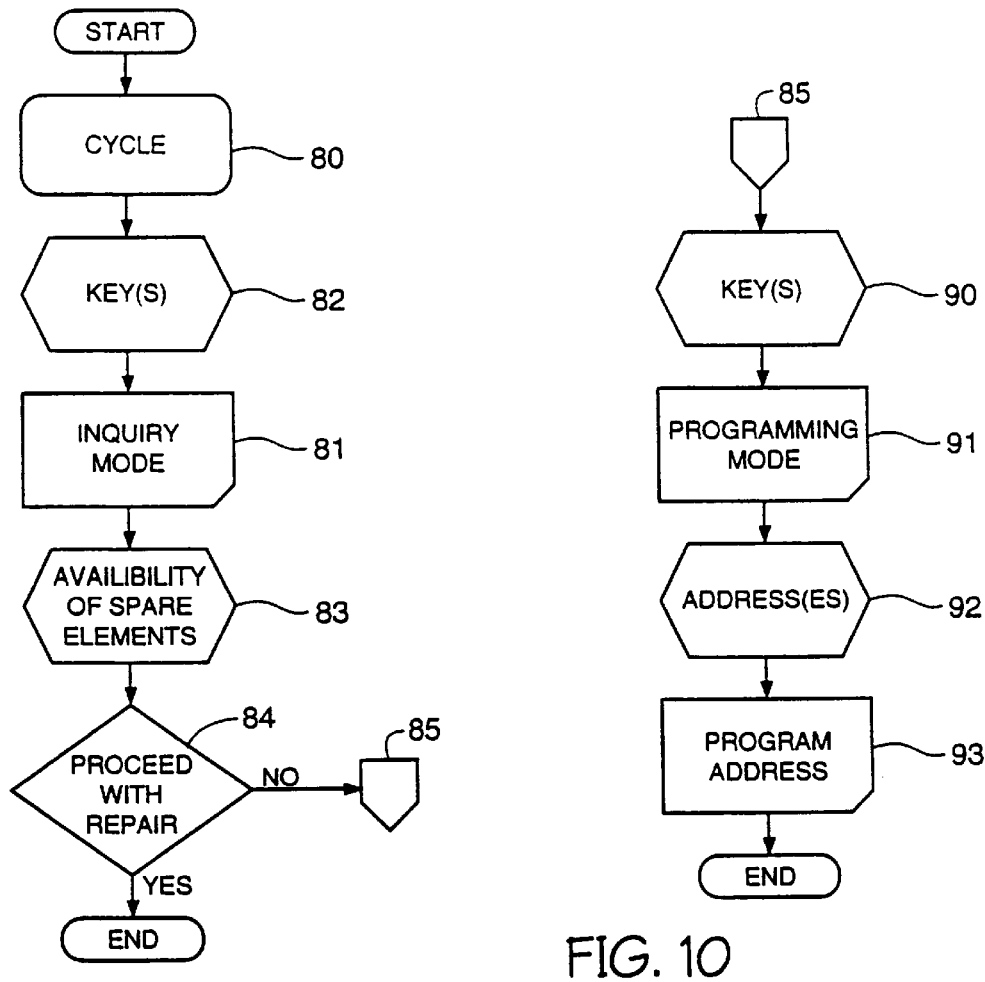
FIG. 9 is a process flow diagram for identification of available elements in a memory device in accordance with the present invention.
FIG. 10 is a process flow diagram for repair of a defective element in a memory device in accordance with the present invention.

Test key 53 puts a memory device portion of memory 11 (shown in FIG. 1) into a test mode 81 (illustratively shown in FIG. 9). Some time later, the portion of memory 11 in test mode 81 (illustratively shown in FIG. 9) provides an indication of whether any spare elements are available. A spare element may be a cell, a sequence of cells (including a row or column of cells or a portion thereof), a block of cells (including multiple rows or columns of cells or portions thereof), an array of cells, and the like. The indication may be provided on DQ1–DQn pins 54 in a form of address(es) or code(s) 59 to indicate available locations of spare elements. Test key 53 may be selective to a particular portion of memory 11 for enabling a test mode 81. For example, test key 53 may be coded for a particular DRAM 32–39 of module 30 (shown in FIG. 3). In other words, circuitry may be provided which is selective to a particular test key 53. By putting a portion of memory 11 (shown in FIG. 1) into test mode 81 (shown in FIG. 9), one or more banks of fuses, antifuses, non-volatile memory elements, and the like may be read out for determining availability of spare elements.

If spare elements are available, latched address 95 on address signal 96 may be programmed to programmable elements of memory 11 (shown in FIG. 1). In which case, programming voltage enable signal 61 transitions from inactive low to active high at time 69 to enable programming. A programming voltage may be generated with voltage pumps internal to a memory chip to be repaired. Alternatively, a programming voltage may be supplied by an external voltage source to a no connect pin of the memory device. Programmable elements may include EEPROM cells, antifuses, and the like. Programming programmable elements enables available redundant or spare element(s) to repair a defective part of memory 11 (shown in FIG. 1). In other words, spare elements effectively take the place of corresponding defective elements.

Figure 6:
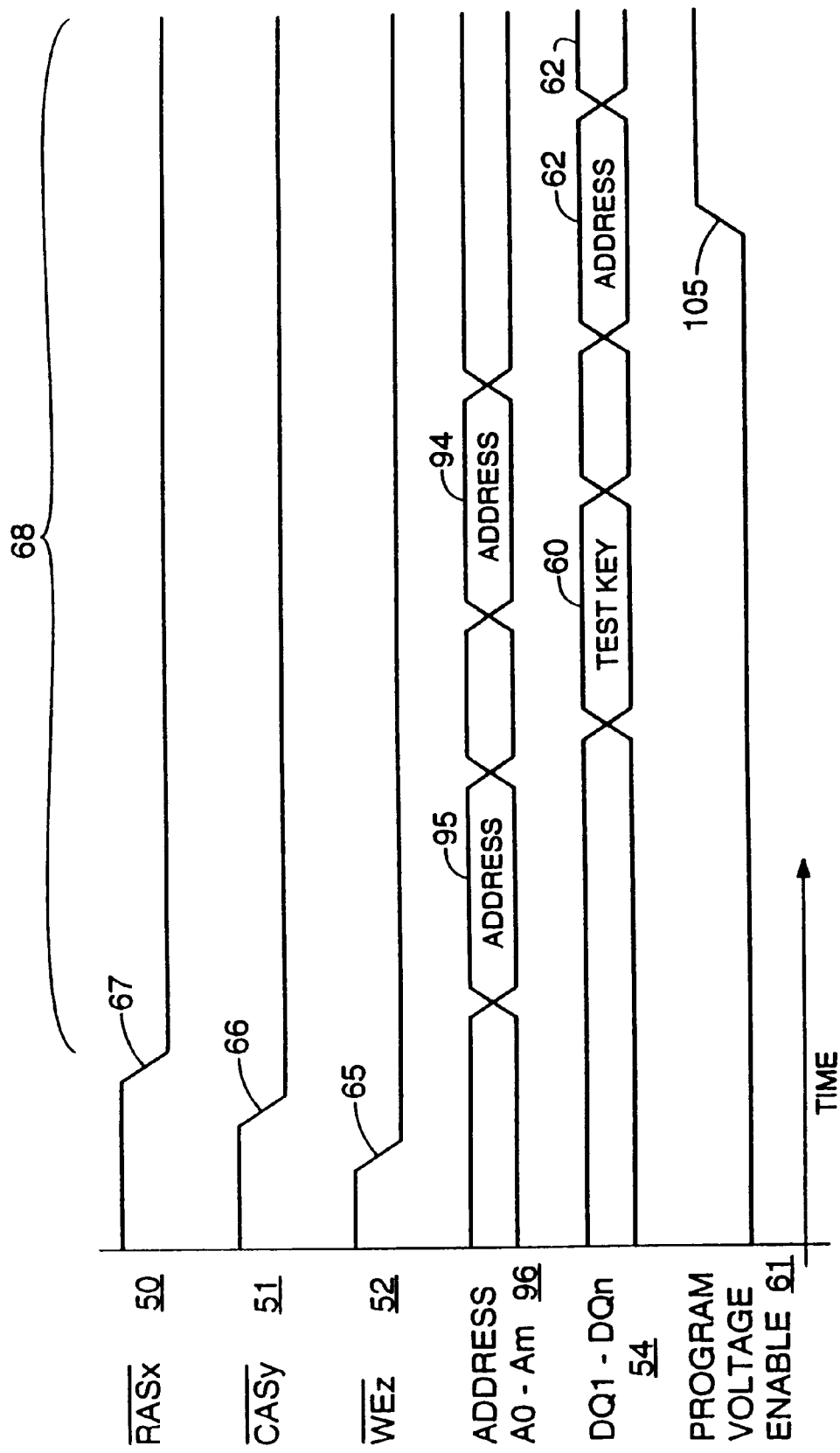
FIG. 6 is a timing diagram for programming a memory device for repair of a defective element therein in accordance with the present invention.

With continuing reference to FIG. 5, as well as reference to FIG. 6, where there is shown a timing diagram for programming a memory device in accordance with the present invention, a second test key approach is described. Transitions of /WEz signal 52, /CASy signal 51, and /RASx signal 50 at times 65, 66, 67, respectively, to invoke WCBR cycle 68. A separate WCBR cycle 68 may be used, or WCBR cycle 58 may continue to be used During WCBR cycle 68, test key 60 is provided on DQ1–DQn pins 54 to memory 11 (shown in FIG. 1). Test key 60 causes a portion of memory 11 to be put into a programming mode, such as programming mode 91 (illustratively shown in FIG. 10). Programming mode 91 (shown in FIG. 10) is for enabling an ability to program programmable elements of memory 11 (shown in FIG. 1). In which case, programming voltage enable signal 61 transitions from inactive low to active high at time 69 to enable programming. A programming voltage may be generated with voltage pumps internal to a memory chip to be repaired. Alternatively, a programming voltage may be supplied by an external voltage source to a no connect pin of the memory device. Programmable elements may include EEPROM cells, antifuses, and the like. Programming programmable elements enables available redundant or spare element(s) to repair a defective part of memory 11 (shown in FIG. 1). In other words, spare elements take the place of defective elements.

Code(s) or address(es) 62 may be supplied to the portion of memory 11 via DQ1–DQn pin 54. Alternatively, address pins 43 (shown in FIG. 4) may be used for supplying one or more addresses 95, 96. Addresses 62 indicated a defective location, and are programmed into programmable elements. At time 105, later than time 69, signal 61 goes active to enable programming. For antifuses, a programming or super voltage is employed for programming the programmable elements.

Figure 7:
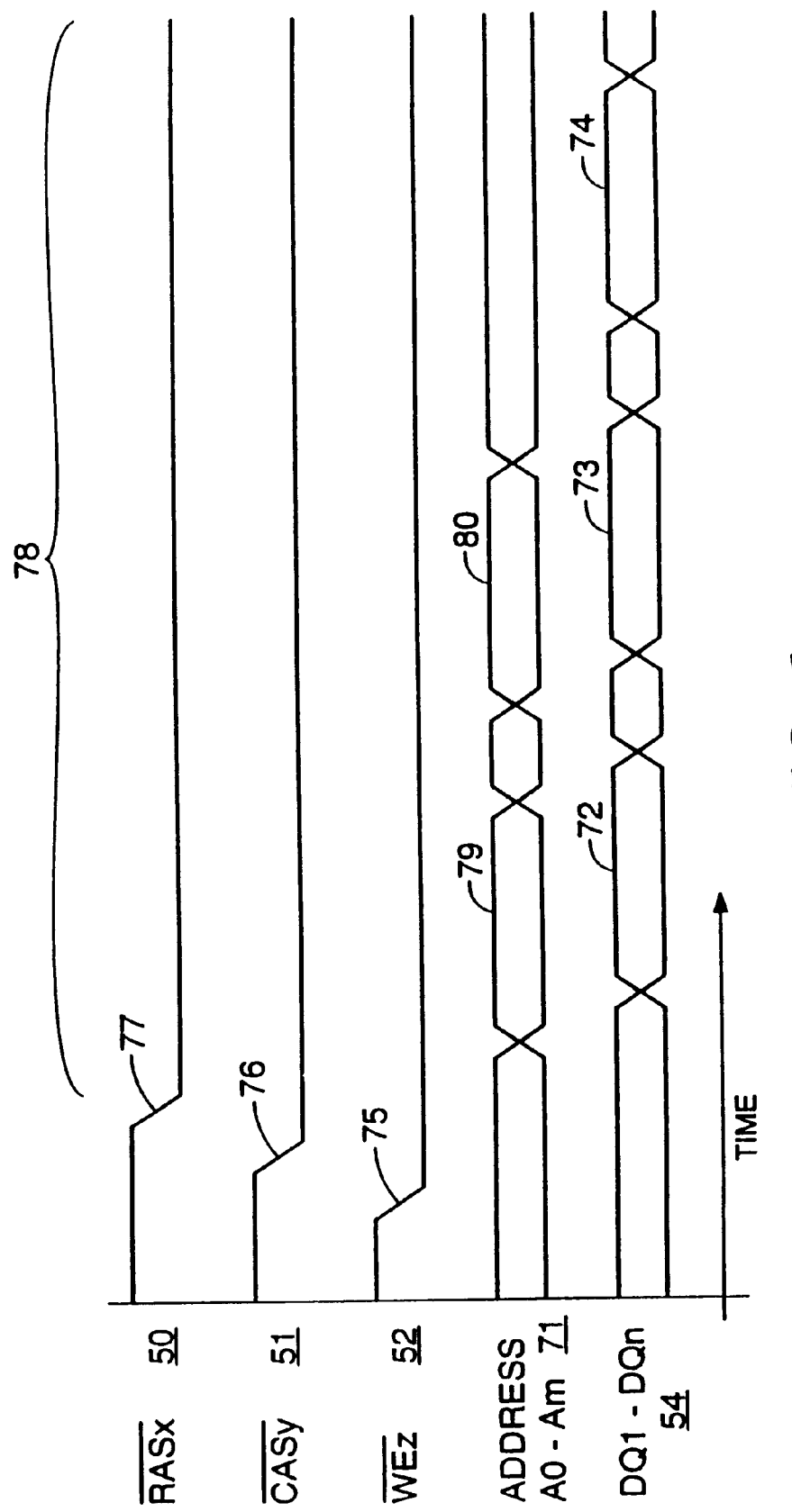
FIG. 7 is a timing diagram for unlocking a memory device for repair of a defective element therein in accordance with the present invention.

Referring to FIG. 7, there is shown a timing diagram for unlocking a memory device in accordance with the present invention. Transitions of /WE signal 52, /CASy signal 51, and /RASx signal 50 at times 75, 76, 77, respectively, invoke WCBR cycle 78. WCBR cycle 78 may be a separate cycle or WCBR cycle 58 or 68 (shown in FIGS. 5 and 6) may be used. During WCBR cycle 78, code 72, 73, 74 on DQ1–DQn pins 54 and/or code 79 and 80 on address A0–Am pins 71 may be employed to unlock a memory device to enable a programming mode sequence for repair. By employing a sequence of address and/or data cycles, prior to beginning a programming cycle, unintentional programming of antifuses may be prevented.

Figure 8:
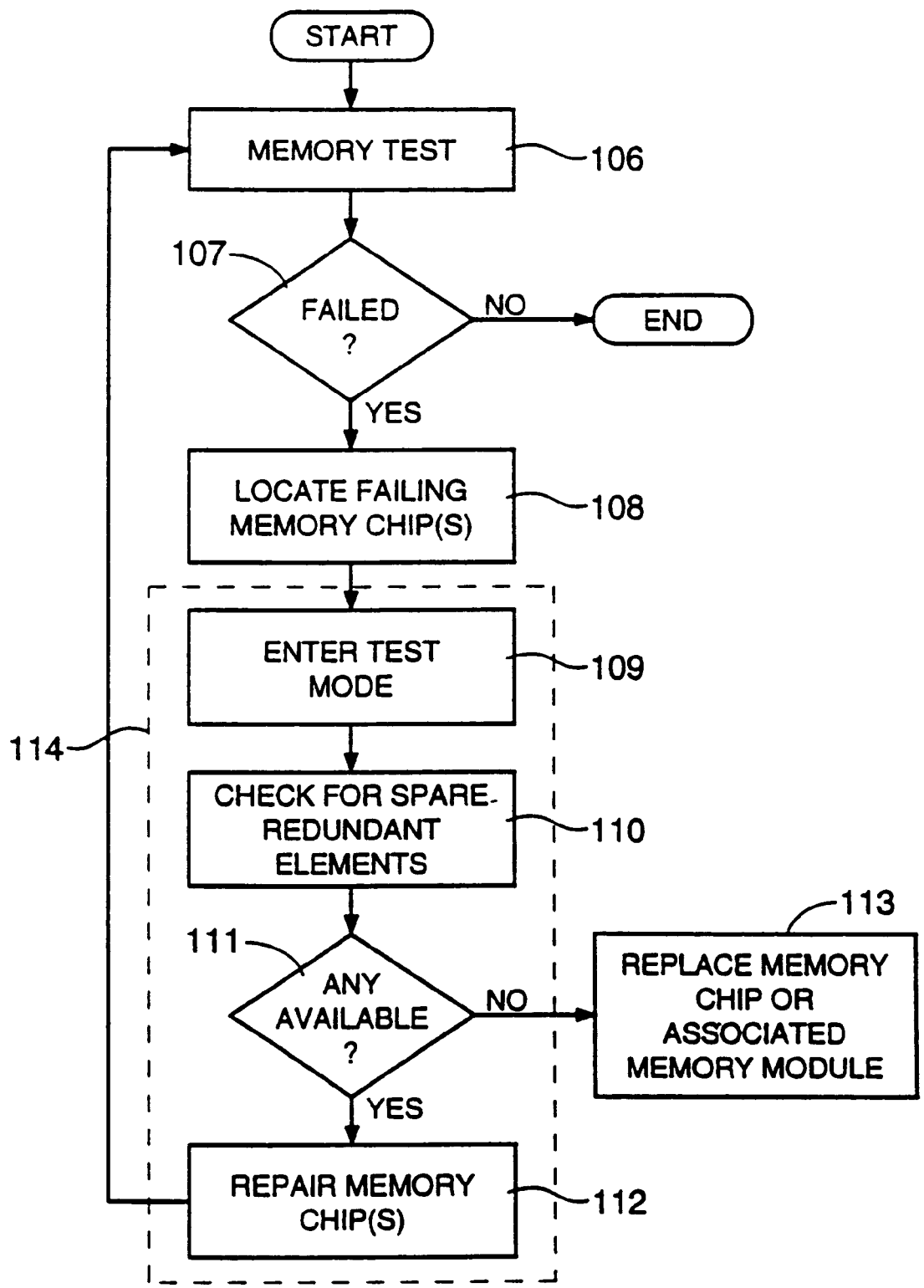
FIG. 8 is a flow chart for testing and repairing a memory in accordance with the present invention.

Referring to FIG. 8, there is shown a process flow diagram for testing and repairing a memory in accordance with the present invention. At step 106, a memory test is invoked. There are a variety of well known tests for memory; most of which involve writing ones and/or zeros to the array and checking those values to see if an error occurs. It is well known that certain patterns written to an array will stress the array more than others, and more particularly, certain patterns will stress a particular feature more so than others. For purposes of the present invention, any such pattern may be written to the memory array by either a remote computer, such as system 104, or locally by system 10.

Notably, computer cache memory and/or DRAM refresh may be disabled to facilitate identification of weak or failing memory cells. At step 107, it is determined whether or not the memory test was successful at step 106. If the test was successful, the process may be terminated. If the process was unsuccessful, in other words, the tested memory failed, then the failing memory chip is located at step 108.

At step 107, it may be determined which address failed; however, it may not be possible to determine which memory chip among a plurality failed, as in most applications the same addressing scheme is used for each chip. Consequently, step 108 allows the particular chip which failed to be identified. Locating a failing memory chip is described in detail in U.S. patent application titled "Method and Apparatus for Back-End Repair of Multi-Chip Modules" by Neville, et al., Ser. No. 08/666,247, filed Jun. 20, 1996, which is incorporated herein as though fully set forth herein.

At step 109, test mode 114 is begun. During test mode 114, a check for spare redundant elements is conducted at step 110. It should be understood that spare redundant elements includes available, previously unallocated memory array elements. Moreover, if a failed address has previously been reprogrammed with a redundant element, it is possible to cancel the previously programmed redundant element in accordance with U.S. patent application entitled "Programmable Device for Redundant Element Cancel in a Memory" by Brian Shirley, Ser. No. 08/563,413, filed Nov. 28, 1995, which is incorporated herein as though fully set forth herein. If there are any available redundant elements located at step 110, the check at step 111 of test mode 114 would indicate so. If there are no available redundant elements, at step 113, an advisory notice to replace the memory chip or associated memory module may be provided. If there are available redundant elements, then at step 112, test mode 114 will initiate programming for repair of the defective memory chip. Repair of the chip is described in more detail with respect to FIGS. 9 and 10 herein. After step 112, another memory test 106 may be repeated to determine if memory 11 (shown in FIG. 1) is now functioning properly.

Referring to FIG. 9, there is shown a process flow diagram for determining availability of spare elements in accordance with the present invention. At step 80, a cycle is invoked to begin an inquiry of a memory device in accordance with the present invention. The cycle may be a WCBR cycle, a CBR cycle, an RCBR cycle, and the like. After invoking a cycle at step 80, one or more keys 82 may be provided. Keys 82 are for invoking a mode at step 81. It should be understood that keys 82 may be used to unlock mode 81. With mode 81 active, an inquiry of availability of spare elements is made at step 83. At step 84, if available elements are found at step 83, then the process may branch to step 85. Otherwise, the process can be terminated.

Referring now to FIG. 10, there is shown a process flow diagram for programming a memory device in accordance with the present invention. With continuing reference to FIG. 10 and renewed reference to FIG. 9, step 85 branches to delivery of one or more keys at step 90. Keys 90 are received to memory device for invoking a programming mode at step 91. Step 90 is optional provided a key at step 82 is also used for invoking programming mode 91. With programming mode 91 invoked, one or more addresses 92 may be provided to memory 11 (shown in FIG. 1). At step 93, one or more defective addresses are programmed to banks of a portion of memory 11 (shown in FIG. 1). Addresses 92 representing defective elements of an array. When addresses 92 are programmed, in a well-known manner rerouting occurs during normal reading or writing.

Figure 11:
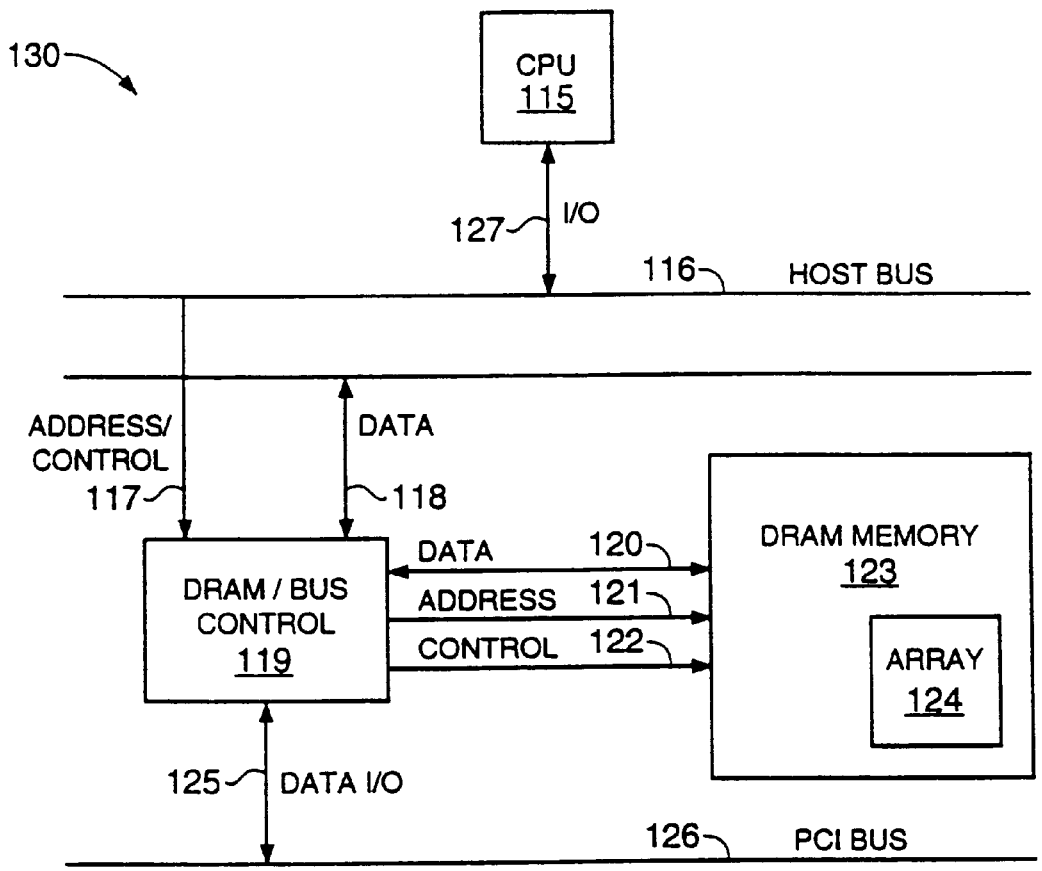
FIG. 11 is a block diagram of an exemplary portion of a personal computer in accordance with the present invention.
Figure 12:
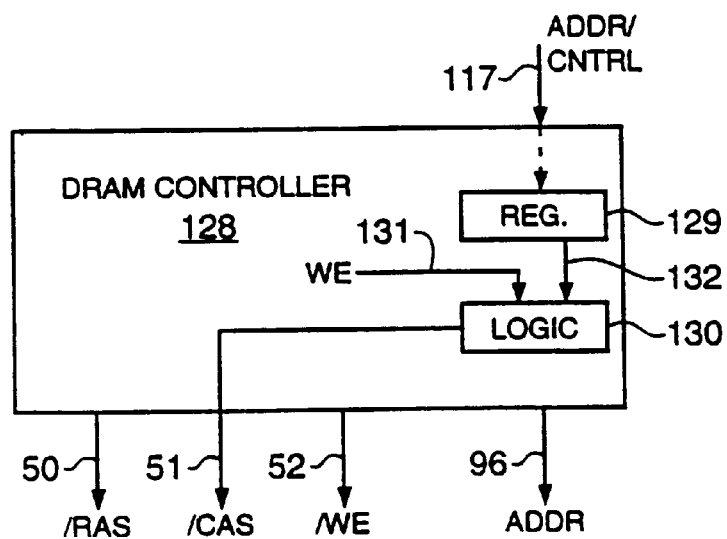
FIG. 12 is a block diagram of an exemplary portion of a memory controller in accordance with the present invention.

Referring now to FIG. 11, there is shown a block diagram of an exemplary portion of a personal computer 130 in accordance with the present invention. Personal computer 130 includes CPU 15, DRAM/Bus controller 119, DRAM memory 123 (including one or more memory arrays 124), host bus 116, and PCI bus 126 (PCI-Peripheral Component Interconnect). CPU 115 is connected to host bus 116 through aisle pathways 127. Address and control information is delivered from CPU 115 through host bus 116 to control 119 via address and control pathways 117. Similarly, data is delivered between CPU 115 and control 119 via host bus 116 and data pathways 118 and I/O pathways 127. Data is also delivered between control 119 and DRAM memory 123 via data pathways 120. Address and control information is delivered from CPU 115 through host bus 116 through I/O pathways 127. Address and control information is delivered from CPU 115 through host bus 116 to control 119 via address and control pathways 117. Similarly, data is delivered between CPU 115 and control 119 via host bus 116 and data pathways 118 and I/O pathways 127. Address and control information is provided along pathways 121, 122. Data is also delivered between bus 126 and control 119 via data I/O pathways 125. Conventional DRAM controls have the ability to initiate a CBR cycle; however, they do not have the ability to initiate a WCBR cycle. Such controllers include those available from Silicon Integrated Systems Corp., including but not limited to SiS 5501 of the Pentium /P54C PCI/ISA chipset. Controller 119 has been modified as shown in FIG. 12 to hold \WE low at the beginning of a CBR cycle in order to provide a WCBR cycle. In this manner, address information and data provided by CPU 115 are passed to DRAM memory 123 under WCBR control of control 119 to enter a special interrogation/repair mode.

Referring now to FIG. 12, there is shown a block diagram of an exemplary portion of controller 128 in accordance with the present invention. Form address/control pathways 117, DRAM controller 128 of control 119 (shown in FIG. 11) may receive information which is stored in storage device 129, such as an address register or decoder. Such information may be a designated key for generating a WCBR cycle 58, 68, 78 (shown in FIGS. 5, 6, 7, respectively). Output signal 132 from register or decoder 129 in combination with WE signal 131 may be provided to logic circuitry 130. /WE signal 52 may thus be held low before or at the beginning of a CBR cycle of control 119 (shown in FIG. 11). By holding /WE signal 52 low at such time, a WCBR cycle 58, 68, 78 (shown in FIGS. 5, 6, 7, respectively) may be initiated.

The present invention may be employed in a variety of devices having a memory array, such devices include but are not limited to application specific integrated circuits, microprocessors, microcontrollers, digital signal processors, and the like. Moreover, such devices may be employed in a variety of systems, such systems include but are not limited to memory modules, network cards, telephones, scanners, facsimile machines, routers, copy machines, displays, printers, calculators, and computers, among others. The present invention has been particularly shown and described with respect to certain preferred embodiments and features thereof. It should be readily apparent to those of ordinary skill in the art that various changes and modifications in form and detail may be made without departing from the spirit and scope of the present invention as set forth in the appended claims.

EXEMPLARY MATERIAL FROM RELATED APPLICATION

Figure 13:
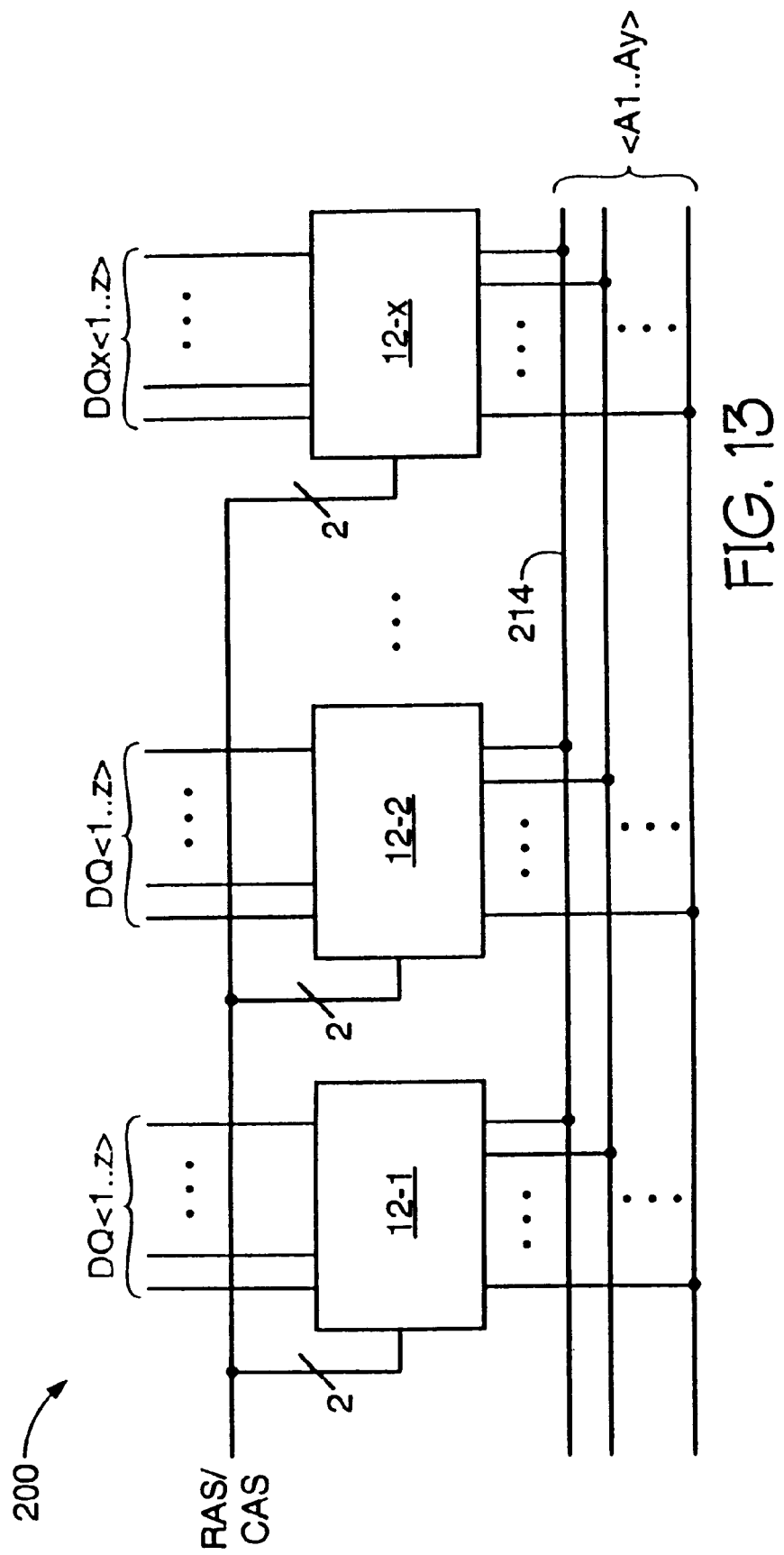
FIG. 13 is a simplified block diagram of a multiple-component memory module of the prior art.

Referring to FIG. 13, there is shown a simplified block diagram of a multiple-component memory module 200 in accordance with one embodiment of the prior art. Although the prior art will be described herein in the context of the memory module of FIG. 13, it is to be understood that the prior art is not limited to this specific application. It is contemplated that the prior art may be advantageously multiple components are coupled together, including but not limited to SIMM, DIMMs, MIMMs, MCMs, and the like. It is believed that those of ordinary skill in the art having the benefit of the present disclosure will be readily able to adapt the exemplary teachings herein to practice the prior art in other applications.

The memory module of FIG. 13 includes a plurality x of individual memory devices 12-1, 12-2 . . . 12-x. Those of ordinary skill in the art will recognize this as a common configuration of a SIMM. In memory module 200 of FIG. 13, memory devices 12-1 . . . 12-x may be separately packaged integrated circuits (IC) mounted on a printed-circuit board type of substrate, or alternatively may be commonly packaged semiconductor dies mounted on a suitable substrate.

As shown in FIG. 13, each memory device 12-1 . . . 12-x has a plurality y of address input pints for receiving y address input signals A1 . . . Ay from an address bus 214. Address bus 214 functions to communicate address signals applied externally to address input terminals of device 200 to the address input pins of memory devices 12-1 . . . 12-x. In accordance with conventional practice, each memory device 12-1 . . . 12-x receives the same y address inputs.

Each memory device 12-1 . . . 12-x also has the plurality z of data input/output (I/O) terminals. As used herein, the term "terminal" or "I/O terminal" will be used to designate a point of connection between a semiconductor device and external sources or designations of digital signals. In this sense, "I/O" should be taken to mean either input or output or both. For example, those of ordinary skill in the art will appreciate that for semiconductor memories, address terminals are typically input terminals only, while data terminals are often both input and output terminals. Nevertheless, both address terminals and data terminals are often referred to as "I/O terminals". Also, for the purposes of this disclosure, a distinction will be made between the electrical terminals of a semiconductor device assembly, such as a SIMM, which facilitate connection of the assembly to other electronic components (e.g., a computer motherboard), and the electrical or I/O terminals of the individual semiconductor devices which make up the assembly (e.g., bond pads or IC leads).

In the presently disclosed embodiment, each device 12-1 . . . 12-x is a z-bit-wise addressable, i.e., each y-bit address accesses z bits of data in the device's array. (For bit-wise addressable memory devices, z=1; for byte-wise addressable memory devices, z=8). In FIG. 13, the data I/O pins for device 12-1 are designated DQ1<1 . . . z>, the data I/O pins for device 12-2 are designated DQ2<1 . . . z> and so on. Also in accordance with conventional practice, the DQ outputs from devices 12-1 . . . 12x are not tied commonly together as the address inputs are. Thus, while a given address <A1 . . . Ay> applied to any one of the memory device—a total of z bits—given address <A1 . . . Ay> applied to memory module 200 would access a particular one of $2^{y-1}$ locations in that device—a total of z bits—a given address <A1 . . . Ay> applied to memory module 200 would access a particular one of $2^{y-1}$ locations in each memory device 12-1 . . . 12x—at total of z times x bits. That is, each address applied to memory module 200 accesses z times x bits, and memory module 200 must therefore have z times x data I/O terminals.

Figure 14:
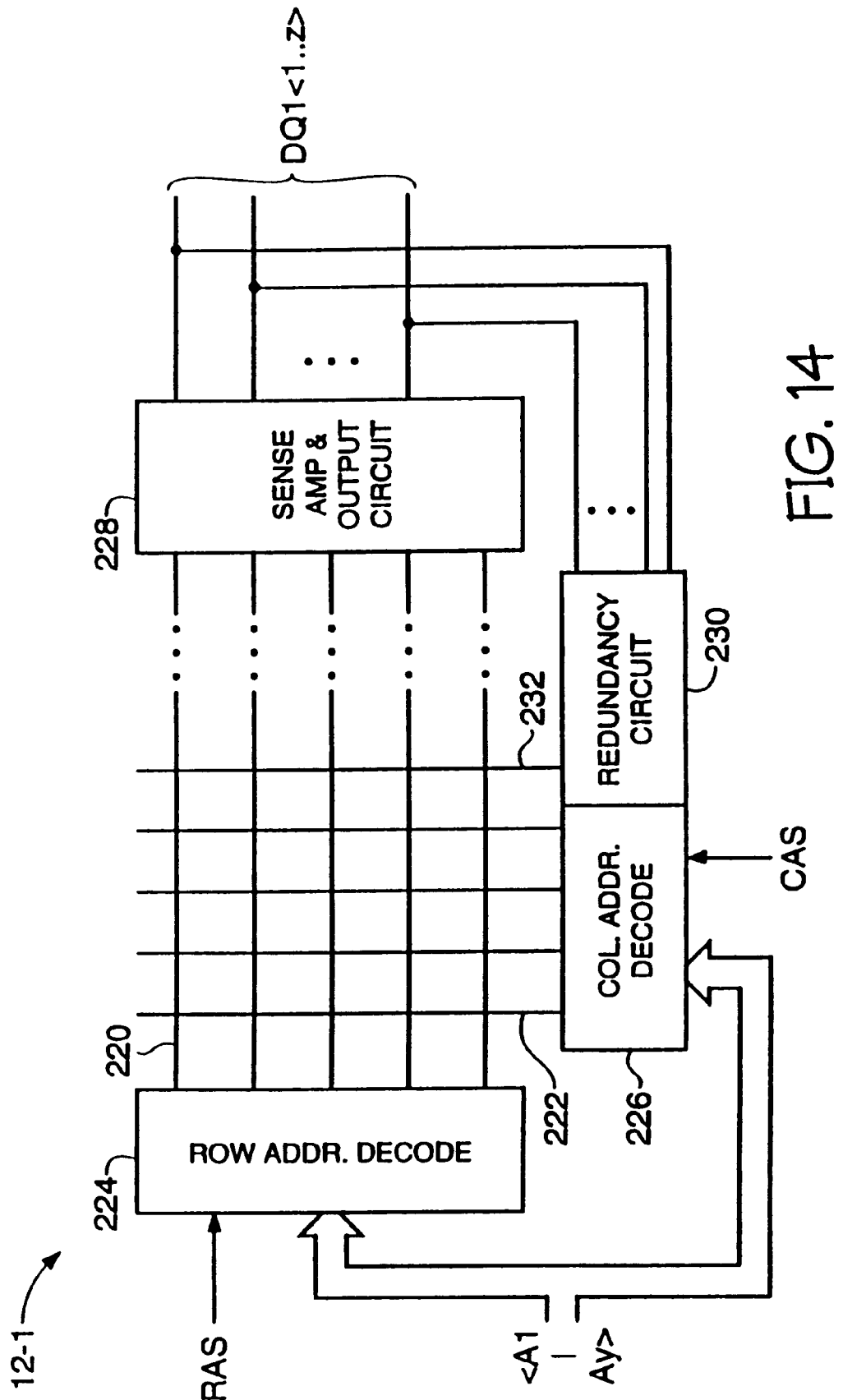
FIG. 14 is a greatly simplified block diagram of a memory device from the memory module of FIG. 13.

Turning now to FIG. 14, there is shown a greatly simplified block diagram of memory device 12-1 from the memory module 200 of FIG. 13, it being understood that in the presently disclosed embodiment, memory devices 12-1 . . . 12x are identical. As shown in FIG. 14, memory device 12-1 comprises an array of row lines 220 and column lines 222 with a memory cell (not shown in FIG. 14) being disposed at every intersection between a row line 220 and a column line 222.

Memory device 12-1 further comprises a row address decoder 224 and a column address decoder 226. Decoders 224 and 226 receive address signals <A1 . . . Ay> from an external source and function to select an individual row and column, respectively, in the array. Row address decoder 224 receive the row address strobe (RAS) signal in order to be informed when a valid row address is appearing on the address inputs to device 12-1. Likewise, column address decoder 226 receives the column address strobe (CAS) signal to be informed when a valid column address is appearing on the address inputs.

Once row and column addresses have been received and decoded in device 12-1, data from the selected memory cell(s) will be sensed by sense amplifier and output circuitry 228, which presents the data on data I/O (DQ) lines DQ1<1 . . . z>.

As thus far described, memory device 12-1 is entirely conventional in character, and no further description of its architecture is believed to be necessary herein for the purposes of describing the prior art. It is believed that those of ordinary skill in the art will be familiar with various implementations of semiconductor memory devices with which the prior art may be practiced.

With continued reference to FIG. 14, memory device 12-1 further comprises column redundancy circuitry 230 associated with column address decode circuitry 226. Redundancy circuitry 230 is provided in order to provide a redundant column line 232 for the array, which may be switched into operation in place of a primary column line to which a defective memory cell is coupled. (In an alternative embodiment, memory device 12-1 could have row redundancy circuitry associated instead of, or in addition to, column redundancy; it is believed that this detail, however, is not relevant to the understanding and practices of the prior art. Also, while memory device 12-1 in FIG. 14 is shown to have only one redundant column line 232, in some applications multiple redundant elements may be provided.

In accordance with conventional practice in the art, redundancy circuitry functions to substitute redundant column 232 for a primary column line 222. While not shown in detail in the Figures, redundancy circuit 230 includes on-time programmable devices, such as conventional fuses, antifuses, or the like, to enable custom programming in accordance with the presently disclosed embodiment.

Figure 15:
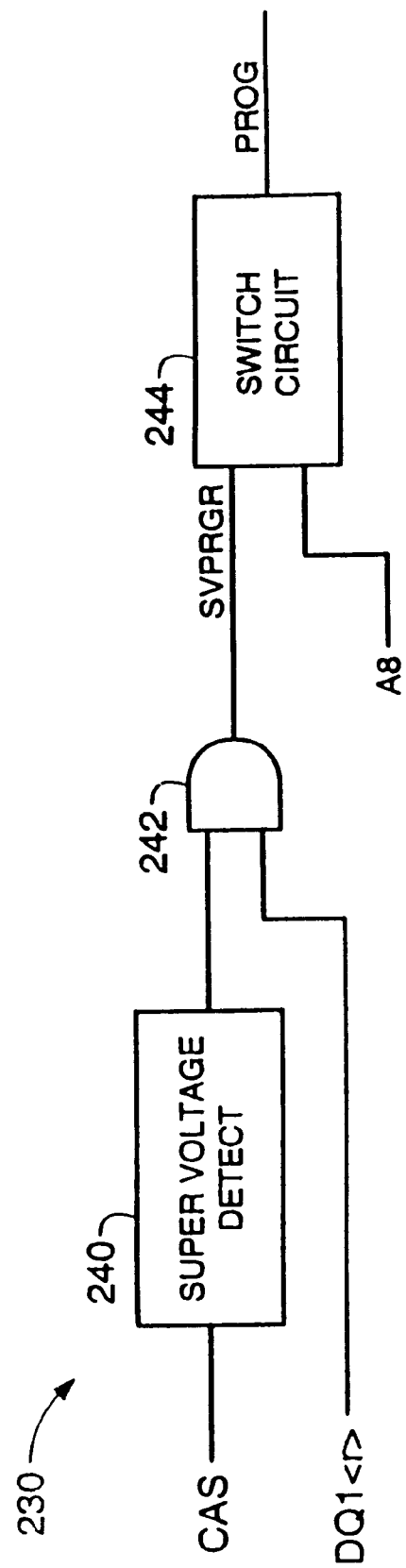
FIG. 15 is a simplified block diagram of a portion of a redundancy circuit of the prior art.

Turning now to FIG. 15, there is shown a simplified block diagram of a portion of redundancy circuit 230 in accordance with the presently disclosed embodiment of the prior art. As noted above, in accordance with common practice in the art, redundancy circuit 230 includes a level detect circuit 240 for detecting a "super-voltage" applied to the CAS input of memory device 1201. The super-voltage is detectable higher than normal CMOS operating voltages, so that detection of the super-voltage can be used as an indicator that redundancy programming is to occur.

Upon detection of a super-voltage on the CAS input, detect circuit 240 asserts a signal designated SCVAS which is applied to one input of an AND gate 242. In accordance with the presently disclosed embodiment of the prior art, another input of AND gate 242 is coupled to one of the data I/O lines DQ<r> is asserted.

SVPRGR is applied to one input of a switch circuit 244. In the presently disclosed embodiment of the prior art, the high energy spiral (programming signal) necessary to actuate or "blow" the fusible links in memory device 12-1 is applied to device 12-1 on one of the address input lines, in the illustrative embodiment, address line A8. Switch circuit 244 performs a single pass gate function to allow the programming signal on address line A8 to pass through to the line designated PROG only when SVPRGR is asserted. PROG, in turn, is applied to the appropriate fusible links to effectuate the desired redundant programming.

Figure 16:
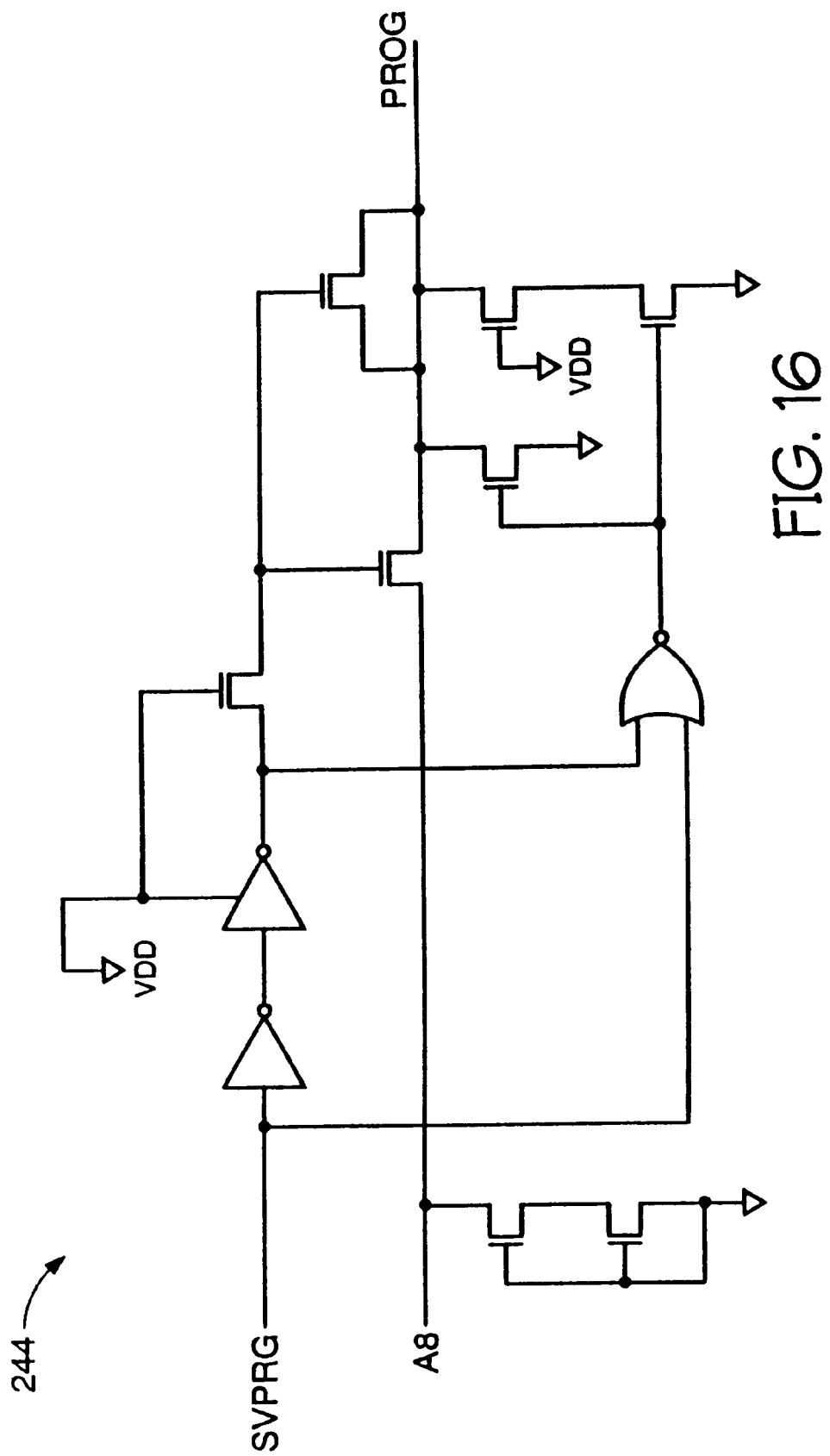
FIG. 16 is a schematic diagram of a switch circuit of the prior art.

It is believed that those of ordinary skill in the art having the benefit of the present disclosure would be readily able to implement switch circuit 244 to perform the function described herein as a matter of routine engineering. However, for the sake of completeness of this disclosure, in FIG. 16, there is shown a schematic diagram of a presently preferred embodiment of switch circuit 244.

Summarizing redundancy programming in accordance with the presently disclosed embodiment of the prior art is accomplished by first applying a super-voltage to the CAS input of the memory device, while simultaneously asserting a predetermined data input signal DQ<r>. If this is done, then the programming voltage applied to address input A8 will be passed through to the fusible links to be blown.

Those of ordinary skill in the art will readily comprehend that there are certain details of implementation of the redundancy programming circuitry that have not been described herein. For example, a person of ordinary skill in the art will appreciate that circuitry will preferably be provided to prevent the programming signal applied to address line A8 during redundancy programming from being applied to address decoding circuits 224 and 226. Additionally, those of ordinary skill in the art will appreciate that redundancy circuit 230 will include decoding circuitry for determining which fusible links are to be blown during redundancy programming. This could be accomplished in numerous ways, for example, by decoding appropriate information applied on address inputs other than A8. It is believed that these and other implementation-specific details are not relevant for the purposes of this disclosure, and in any event would be a matter of routine design and engineering to those of ordinary skill in the art.

An important aspect of the prior art lies in the configuration or redundancy detect circuit 230 to require assertion of one (or more, in alternative embodiments) data I/O lines in order to perform redundancy programming. As a result of this configuration, and also as a result of the signal routing in conventional multi-chip modules, such as depicted in FIG. 13, redundancy programming of one device in a multi-device assembly can be carried out without unnecessary and undesirable programming of other devices in assembly.

In particular, independent redundancy programming of individual devices incorporated into a multiple-device assembly is made possible through including among the I/O terminals used for redundancy programming terminals of the individual devices which are coupled to I/O terminals of the overall assembly but which are not coupled to corresponding terminals of any other device in the assembly. In this way, a combination of programming signals applied to the I/O terminals of the assembly can uniquely identify an individual device in the assembly. Although the prior art has been described herein in the context of a SIMM, it is contemplated that the prior art may be advantageously applied to other types of semiconductor device assemblies. Also, while the redundant element in the disclosed embodiment was a redundant row or column of memory cells in a semiconductor memory, it is believed that other types of redundant functional elements that may be independently programmed or activated in accordance with the prior art.

What is claimed is:

1. A system comprising:
    a memory device having a matrix of cells and having signal inputs; and
    a memory controller in electrical communication with the memory device, the memory controller to provide a sequence of control signals, including RAS and CAS signals, to the signal inputs, the sequence of control signals to condition the memory device to receive a key, the memory device in response to the key put into a mode to repair a defective one of said matrix of cells.

2. A memory controller comprising:
    a storage device to store information; and
    logic circuitry configured to initiate a write-column-address-strobe-before-row-address-strobe (WCBR) cycle in response to the information stored.

3. A memory repair system comprising:
    a first computer system comprising:
        a processing unit;
        a memory controller in electrical communication with the processing unit;
        a memory in electrical communication through RAS, CAS, address, and data signals with the memory controller, the memory including an array of memory cells; and
        an input/output device in electrical communication with the processing unit;
    a communication transport in communication with the first system through the input/output device; and
    a second computer system programmed to repair the memory of the first system, the second computer system in communication with the first computer system through the communication transport.

4. A memory repair system, as in claim 3, wherein the second computer system is remotely located with respect to the first computer system.

5. A memory repair system, as in claim 4, wherein the communication transport comprises reception/transmission communication equipment.

6. A memory repair system, as in claim 4, wherein the input/output device is selected from a modem, a network interface, and a broadcast receiver/transmitter.

7. A memory repair system, as in claim 4, wherein the memory controller comprises circuitry for initiating a write-column-address-strobe-before-row-address-strobe (WCBR) cycle.

8. A memory repair system, as in claim 7, wherein the memory is a memory module.

9. An apparatus comprising:
    a programmed computer having a memory controller and a memory device, the memory device having a matrix of memory cells, the programmed computer including programming to repair the memory while installed in the computer;
    the programmed computer operable in response to the programming to condition the memory controller to initiate a reserved cycle, to provide a key to the memory device, without adding a control line, to put the memory device into a mode with the key, to read from the memory device existence of at least one available redundant element, to provide an address to the memory device relating to a defective cell, and to program the memory device for accessing the redundant element.

10. An apparatus comprising:
    a programmed computer having a memory controller and a memory device, the memory device having a matrix of memory cells, the programmed computer including programming to repair the memory while installed in the computer;

the programmed computer operable in response to the programming to condition the memory controller to initiate at least one column-address-strobe-before-row-address-strobe (CBR) cycle, to provide a key to the memory device, to put the memory device into a mode with the key, and to identify a defective cell of the memory device.

11. An apparatus, as in claim 10, wherein the CBR cycle is selected from read CBR cycles and write CBR cycles.

12. A system comprising:

a programmed computer having a memory controller and a memory device, the memory device having a matrix of memory cells, the programmed computer including programming to repair the memory while installed in the computer;

the programmed computer operable in response to the programming to condition the memory controller to initiate at least one reserved cycle, to provide at least one key to the memory device, to put the memory device into at least one mode with the key, to identify any defective cell of the memory cells, to read from the memory device existence availability of at least one redundant element, to provide at least one address to the memory device relating to the defective cell, and to program the memory device for accessing the redundant element to replace the defective cell.

13. A method for repair of a memory device having at least one defective memory cell in an array of memory cells, the method comprising:

providing a reserved cycle to the memory device by transitioning in sequence a WE signal, a CAS signal, and a RAS signal;

providing at least one key to the memory device while in the reserved cycle;

putting the memory device into at least one mode with the key;

identifying the defective memory cell;

reading from the memory device existence of at least one available redundant element;

providing an address to the memory device relating to the defective memory cell; and programming the memory device for accessing the redundant element instead of the defective memory cell.

14. A method, as in claim 13, wherein the memory device is programmed with the address.

15. A method, as in claim 13, wherein putting the memory device into the mode comprises:

unlocking the memory device.

16. A method, as in claim 13, further comprising:

after reading, receiving a test key to the memory device; and putting the memory device into a program mode with the test key.

17. A method, as in claim 16, wherein the step of putting the memory device into the program mode comprises:

unlocking the memory device.

18. A method of repairing a portion of a memory having matrix of memory elements, the matrix comprising a defective element and a redundant element, the method comprising:

providing a sequence of signals including a RAS signal and a CAS signal to the memory;

invoking a reserved cycle of the memory;

providing a code key to the memory;

invoking a inquiry mode using the code key;

identifying a location associated with the defective element; and determining availability of the redundant element.

19. A method as in claim 18, further comprising:

providing a program key to the memory; and invoking a program mode of the memory.

20. A method, as in claim 19, further comprising:

providing another sequence of signals to the memory;

invoking another reserved cycle of the memory; and conditioning the memory to process the program key.

21. A method, as in claim 20, wherein the step of conditioning comprises:

receiving an address to the memory; and programming the memory with the address for accessing the redundant element.

22. A method, as in claim 21, further comprising:

unlocking the memory for invoking the program mode.

23. An apparatus comprising:

a programmed computer comprising:

a memory including programming and at least one memory device, the memory device having a matrix of cells and having signal inputs; and a memory controller including a RAS signal and a CAS signal in electrical communication through the RAS signal and the CAS signal with the memory device, the memory controller to provide a sequence of control signals to the signal inputs in response to the programming, the sequence of control signals to condition the memory device to receive a key, the key to put the memory device into a mode for repairing a defective one of said matrix of cells.

24. A method for repairing a memory module while installed in a computer, the memory module having a plurality of memory chips each having an array of memory elements, the method comprising:

providing a reserved sequence of control signals including RAS and CAS signals to the memory module;

initiating a memory test of the memory module while installed in the computer;

identifying a defective cell of said memory elements;

locating which memory chip of said memory chips includes the defective cell;

initiating a test mode for the memory chip while installed in the computer;

determining availability of a redundant element of said memory elements; and programming the memory chip to access the redundant element instead of the defective cell.

25. A method, as in claim 24, further comprising:

repeating the steps of the method until all defective cells are repaired.

26. A method for repair of a memory while installed in a computer, the memory having an array of cells, the method for repairing one or more bit errors in the array, the method comprising:

providing a reserved cycle to the memory while installed in the computer;

providing a first test key to the memory while installed in the computer;

activating a test mode in response to the first test key;

determining locations of one or more defective cells;

ascertaining availability of one or more spare cells;

activating a program mode in response to a second test key;

providing a location associated with one or more of the defective cells; and using the location to program the memory.

27. A method, as in claim 26, wherein the spare cells are selected from redundant rows and redundant columns.

28. A method, as in claim 26, wherein the memory is one of plurality of memories of a module.

29. A method, as in claim 26, wherein the memory includes at least one antifuse bank, the antifuse bank being programmed with an address associated with the defective cells.

30. A method, as in claim 29, wherein the antifuse bank is programmed with a programming voltage, the programming voltage provided by at least one voltage pump internal to the memory.

31. A method, as in claim 26, further comprising:

unlocking the memory prior to invoking the program or the test mode.

32. A method, as in claim 31, wherein unlocking comprises providing another reserved cycle.

33. A method, as in claim 32, wherein the reserved cycle includes information selected from the group consisting of address and data information.

34. A method, as in claim 26, wherein the spare cells are selected from a spare block of cells, a spare row of cells, a spare column of cells, and a spare sequence of cells.

35. A method, as in claim 26, further comprising:

providing a second test key in response to the availability of the spare cells.

36. A method, as in claim 35, further comprising:

providing another reserved cycle prior to providing the second test key.

37. A memory controller comprising:

a register to store information; and logic circuitry configured to initiate a write-column-address-strobe-before-row-address-strobe (WCBR) cycle in response to the information stored.

38. A memory controller, as in claim 37, wherein the register is an address register.

39. A memory controller comprising:

a decoder to store information; and logic circuitry configured to initiate a write-column-address-strobe-before-row-address-strobe (WCBR) cycle in response to the information stored.

40. A memory controller, as in claim 39, wherein the decoder is an address decoder.

* * * * *

UNITED STATES PATENT AND TRADEMARK OFFICE
CERTIFICATE OF CORRECTION

PATENT NO. : 6,154,851
DATED : Nov. 28, 2000
INVENTOR(S) : Sher et al.

It is certified that error appears in the above-identified patent and that said Letters Patent is hereby corrected as shown below:

On the title page, section [75], delete "Gerg" and insert --Greg--, therefore.

Signed and Sealed this

Twenty-ninth Day of May, 2001

*Attest:*

NICHOLAS P. GODICI

*Attesting Officer*     *Acting Director of the United States Patent and Trademark Office*